US006091099A

United States Patent [19]

Kiyotoshi et al.

[11] Patent Number: 6,091,099

[45] **Date of Patent: *Jul. 18, 2000**

[54] SEMICONDUCTOR DEVICE WITH TANTALUM AND RUTHENIUM

[75] Inventors: Masahiro Kiyotoshi, Sagamihara; Kazuhiro Eguchi, Chigasaki, both of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/969,702

[22] Filed: Nov. 13, 1997

[30] Foreign Application Priority Data

Nov. 14, 1996 [JP] Japan .................................... 8-302990

[51] Int. Cl.[7] ......................... H01L 27/108; H01L 29/76; H01L 29/94; H01L 31/119

[52] U.S. Cl. .......................... 257/310; 257/532; 257/628; 257/753; 257/761; 438/650; 438/685

[58] Field of Search .................................... 257/310, 296, 257/306, 761, 753, 627, 628, 532; 438/685, 650

[56] References Cited

U.S. PATENT DOCUMENTS

| | | | |
|---|---|---|---|
| 5,293,510 | 3/1994 | Takenaka | 257/295 |
| 5,466,629 | 11/1995 | Mihara et al. | 437/60 |
| 5,486,713 | 1/1996 | Koyama | 257/310 |
| 5,717,236 | 2/1998 | Shinkawata | 257/306 |
| 5,801,105 | 9/1998 | Yano et al. | 438/785 |

FOREIGN PATENT DOCUMENTS

| | | |
|---|---|---|
| 62-222616 | 9/1987 | Japan . |
| 3-87055 | 4/1991 | Japan . |
| 7-46670 | 5/1995 | Japan . |

*Primary Examiner*—William Mintel

*Attorney, Agent, or Firm*—Finnegan, Henderson, Farabow, Garrett & Dunner, L.L.P.

[57] ABSTRACT

Disclosed is a semiconductor device, comprising a semiconductor substrate, a cell transistor formed in the semiconductor substrate, an interlayer dielectric film in which is formed a contact hole communicating with a part of the cell transistor, a contact plug buried in the contact hole formed in the interlayer dielectric film, a capacitor lower electrode formed of a ruthenium/tantalum laminate film consisting of a tantalum film and a ruthenium film formed on the tantalum film, the lower electrode being formed on interlayer dielectric film and connected to the contact plug, a capacitor dielectric film formed on the ruthenium film included in the capacitor lower electrode and consisting of a metal oxide, and a capacitor upper electrode formed on the capacitor dielectric film, the ruthenium film exhibiting (00n) dominant orientation, where n denotes a positive integer.

11 Claims, 3 Drawing Sheets

SEMICONDUCTOR DEVICE WITH TANTALUM AND RUTHENIUM

BACKGROUND OF THE INVENTION

The present invention relates to a semiconductor device using a metal oxide thin film as a capacitor dielectric film and a method of manufacturing the same.

It is possible to allow an electronic device to perform a required function by improving the circuit construction. In addition, with recent progress in miniaturization of electronic devices, it is advantageous to use a functional thin film capable of utilizing the characteristics of the film material itself for achieving the required function.

Particularly, the cell area is now greatly diminished in integrated circuits including those using many transistors in combination for storing information such as SRAM (Static Random Access read write Memory) and EEPROM (Electrically Erasable and Programmable Read Only Memory), and those using transistors and capacitors in combination for storing information such as DRAM (Dynamic Random Access Memory) and FRAM (Ferroelectric Random Access read write Memory). It is now very difficult to form these integrated circuits by using the conventional MOS transistors and MOS capacitors.

Particularly, in order to prevent the S/N ratio from being lowered, a capacitor is required to maintain a predetermined capacitance even if the minimum processing dimension of the integrated circuit is diminished. As a material of a dielectric film of a capacitor meeting this requirement, attentions are paid to functional materials exhibiting a dielectric constant higher than that of a silicon oxide film or a silicon nitride/silicon oxide laminate film (NO film).

Metal oxides having a perovskite crystal structure such as $Ba_xSr_{1-x}TiO_3$ (BST) and $PbZr_xTi_{1-x}O_3$ (PZT) exhibit a dielectric constant of several hundred at room temperature and, thus, are useful as capacitor dielectric film. In using a thin film of the metal oxide as a capacitor dielectric film, it is impossible to use a conventional material of polycrystalline silicon (poly-Si) for forming an electrode, particularly, a lower electrode. If a metal oxide thin film is formed directly on the poly-Si electrode, the surface of the poly-Si electrode is oxidized to form a $SiO_2$ layer having a small dielectric constant. It follows that the effective amount of charge accumulated in the capacitor is determined by the capacitance of the $SiO_2$ layer.

To overcome the above-noted difficulty, a noble metal such as platinum (Pt), iridium (Ir), ruthenium (Ru), rhenium (Re), or osmium (Os) is generally used for forming the lower electrode of a capacitor using a dielectric thin film of BST or PZT. Platinum is scarcely oxidized. The other noble metals such as Ir, Ru, Re and Os may be oxidized to some extent. However, the oxides of these noble metals act as conductors. Because of the low reactivity with oxygen, these noble metals are used for forming the electrode of a capacitor including a metal oxide dielectric thin film.

As pointed out above, ruthenium, even if oxidized, forms a conductive oxide. In addition, ruthenium tetraoxide ($RuO_4$) has a high vapor pressure, making it possible to subject a Ru electrode to dry etching widely employed nowadays in the manufacture of a semiconductor device. It is also possible to connect a Ru electrode directly to a contact plug generally made of poly-Si without interposing a barrier metal. Such being the situation, Ru is considered to be the most prospective electrode material.

However, because of the low reactivity, Ru fails to adhere strongly to the poly-Si contact plug or to a base layer such as an interlayer insulating film. As a result, the Ru film tends to peel in the subsequent heating step or sintering step. In addition, Ru has a high melting point unlike other noble metals such as Pt. It follows that a Ru film, if formed under low temperatures, has a low crystallinity. If a heat treatment is applied to a Ru film having a low crystallinity, a change in stress accompanying a change in the crystallinity of Ru causes the Ru film to peel more easily from the under layer or from the dielectric film formed on the Ru film.

As described above, a Ru film exhibits excellent characteristics if used as a lower electrode of a capacitor including a metal oxide dielectric thin film. However, since Ru is low in reactivity, the Ru film fails to adhere strongly to a base layer and tends to peel. It follows that reliability of the capacitor including a metal oxide dielectric thin film is lowered.

BRIEF SUMMARY OF THE INVENTION

An object of the present invention is to provide a semiconductor device comprising a capacitor including a metal oxide dielectric thin film, which permits forming a high quality ruthenium film having a low stress and capable of good adhesion to a base layer so as to contribute to improvement in the reliability of the capacitor.

Another object is to provide a method of manufacturing the above-noted semiconductor device.

According to a first aspect of the present invention, there is provided a semiconductor device, comprising a substrate, and a capacitor formed on the substrate and including a lower electrode formed of a ruthenium/tantalum laminate film consisting essentially of a tantalum film and a ruthenium film formed on the tantalum film, a metal oxide thin film formed on the ruthenium film of the lower electrode, and an upper electrode formed on the metal oxide thin film, the ruthenium film exhibiting (00n) dominant orientation, where n denotes a positive integer.

According to a second aspect of the present invention, there is provided a semiconductor device, comprising a semiconductor substrate, a cell transistor formed in the semiconductor substrate, an interlayer insulating film in which is formed a contact hole communicating with a part of the cell transistor, a contact plug buried in the contact hole formed in the interlayer insulating film, a capacitor lower electrode formed of a ruthenium/tantalum laminate film consisting essentially of a tantalum film and a ruthenium film formed on the tantalum film, the lower electrode being formed on the interlayer insulating film and connected to the contact plug, a capacitor dielectric film consisting essentially of a metal oxide and formed on the ruthenium film included in the lower electrode, and a capacitor upper electrode formed on the capacitor dielectric film, the ruthenium film exhibiting (00n) dominant orientation, where n denotes a positive integer.

According to a third aspect of the present invention, there is provided a method of manufacturing a semiconductor device, comprising the steps of forming a tantalum film on a substrate, forming a ruthenium film on the tantalum film at 100° C. or less, the ruthenium film exhibiting (00n) dominant orientation, where n denotes a positive integer, forming a metal oxide thin film on the ruthenium film, and forming an electrically conductive film on the metal oxide film.

Further, according to a fourth aspect of the present invention, there is provided a method of manufacturing a semiconductor device, comprising the steps of forming an interlayer insulating film on a semiconductor substrate having a cell transistor formed therein in advance, forming a contact hole in the interlayer insulating film such that the contact hole communicates with a part of the cell transistor, burying a contact plug in the contact hole, forming a tantalum film connected to the contact plug on the interlayer insulating film, forming a ruthenium film at 100° C. or less on the tantalum film, the ruthenium film exhibiting (00n) dominant orientation, where n denotes a positive integer, patterning a laminate film consisting of the tantalum film and the ruthenium film to form a lower electrode of a capacitor, forming a metal oxide dielectric thin film on the patterned ruthenium film, and forming an upper electrode on the dielectric thin film.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
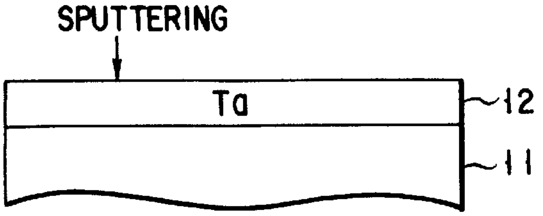
FIGS. 1A to 1C are cross sectional views collectively showing how to form a capacitor including a metal oxide dielectric thin film in the present invention.

A semiconductor device of the present invention comprises a capacitor. In the present invention, a Ru/Ta laminate film consisting of a tantalum film and a ruthenium film formed on the Ta film is used as a lower electrode of the capacitor.

The Ru film is required to exhibit (00n) dominant orientation, where n denotes a positive integer. Also, it is desirable for the Ta film to exhibit (311) or (00n) dominant orientation, where n denotes a positive integer. In general, n is 1, 2 or 3.

The thickness of the Ru film may desirably be at least 2 nm, preferably at least 5 nm. Where the film is thinner than 2 nm, the film orientation tends to be less uniform. On the other hand, the thickness of the Ta film may desirably be at most 50 nm, preferably 5 to 25 nm. Where the thickness exceeds 50 nm, a change in crystalline orientation of the Ta film causes a surface roughness of the Ru film formed on the Ta film to be increased, leading to an increased current leakage.

The capacitor formed in the semiconductor device of the present invention includes a metal oxide dielectric thin film formed on the lower electrode of the Ru/Ta laminate film. The metal oxide used for forming the dielectric thin film includes, for example, $Ba_xSr_{1-x}TiO_3$ ($0 \leqq x \leqq 1$) (BST), $PbZr_xTi_{1-x}O_3$ ($0 \leqq x \leqq 1$) (PZT), (Pb, La)(Zr, Ti)$O_3$, Ba(Ti, Sn)$O_3$, $SrBi_2Ta_2O_9$, and $Ta_2O_5$. The thickness of the metal oxide dielectric thin film may desirably be 5 to 100 nm.

The material of the upper electrode formed on the dielectric thin film of the capacitor, which is not particularly limited in the present invention, includes, for example, ruthenium, ruthenium dioxide, platinum, indium, and indium dioxide. The thickness of the upper electrode may desirably be at least 5 nm.

The present invention also provides a semiconductor device comprising a cell transistor formed in a semiconductor substrate and a capacitor connected to the cell transistor via a contact plug. The contact plug is buried in a contact hole formed through an interlayer insulating film formed on the semiconductor substrate and communicating with a part of the cell transistor. In general, the interlayer insulating film is formed of silicon oxide, and the contact plug is formed of polycrystalline silicon (poly-Si).

To reiterate, the capacitor formed in the semiconductor device of the present invention includes a Ru/Ta laminate film as a lower electrode. The Ru film constituting the upper layer of the laminate film may desirably be formed at 100° C. or less, preferably 10 to 100° C. It is desirable to employ a sputtering method for forming these Ta and Ru films. Further, it is desirable to form the metal oxide dielectric thin film by chemical vapor deposition (CVD) at preferably 600° C. or less, more preferably 300 to 500° C.

The Ru film included in the capacitor lower electrode of the Ru/Ta laminate film is required to exhibit (00n) dominant orientation, n being a positive integer. The Ru/Ta laminate film, which produces an excellent adhesion, exhibits an excellent crystallinity, is low in stress, and is unlikely to peel even after heat treatments.

The lower electrode consisting of the Ru/Ta laminate film exhibits a very high thermal stability and a high crystallinity. In the present invention, a good metal oxide thin film, e.g., a film having a high dielectric constant, is formed on the particular lower electrode. Where a thin film formed of the particular metal oxides specified in the present invention is used as a dielectric film included in a capacitor, a capacitor capable of accumulating a very large amount of electric charge can be formed with a high stability, making it possible to manufacture easily a memory device having a high degree of integration.

A Ru film having a thermal stress close to zero (less than $2\times10^9$ dyn/cm$^2$) and exhibiting (00n) dominant orientation, n being a positive integer, can be formed easily on the Ta film by a sputtering method performed at room temperature (not higher than 100° C.). Where the Ta film exhibits (311) or (00n) dominant orientation, n being a positive integer, the Ru film exhibiting (00n) dominant orientation can be formed more easily on the Ta film. Incidentally, the Ta film can be formed on an optional film as far as reaction with Ta does not take place. Also, if the metal oxide thin film is formed on the Ru film at relatively low temperatures (not higher than 600° C.), it is possible to avoid inconveniences such as oxidation of the Ru film in the step of forming the metal oxide thin film.

Figure 1B:
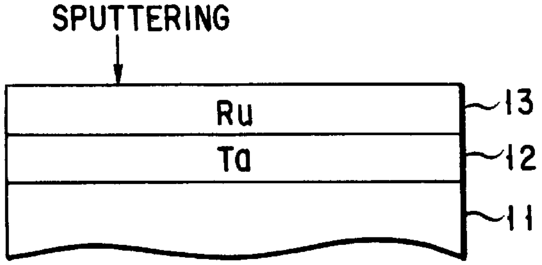
Figure 1C:
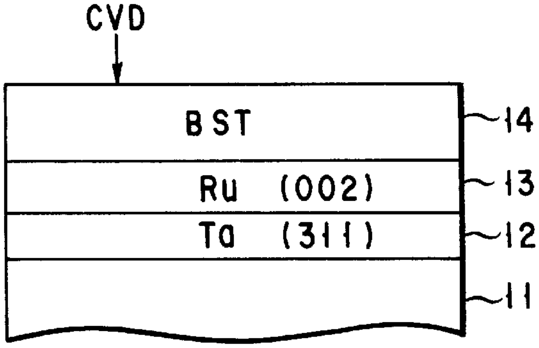

FIGS. 1A to 1C collectively exemplify the most desirable process that can be employed in the present invention. In the first step, a Ta film 12 is formed by a sputtering method at temperatures not exceeding 100° C. on a substrate 11 flattened by, for example, an interlayer insulating film, as shown in FIG. 1A. Then, a Ru film 13 is formed by a sputtering method at temperatures not exceeding 100° C. on the Ta film 12, as shown in FIG. 1B. Further, a BST thin film

14 is formed by a CVD method at temperatures not exceeding 600° C. on the Ru film 13, as shown in FIG. 1C. The Ta film 12 thus formed exhibits (311) dominant orientation. Also, the Ru film 13 exhibits (002) dominant orientation. Of course, the laminate structure consisting of the Ta film 12 and the Ru film 13 acts as a lower electrode of a capacitor.

The Ru film 13 formed by the method described above strongly adheres to the base layer (Ta film 12) and bears a low stress, making it possible to form the BST film 14 (metal oxide thin film) on the Ru film 13 with a high stability and, thus, to improves the reliability of the resultant capacitor including the BST film 14 as a dielectric film.

Let us describe the basic principle of the present invention. Specifically, a Ru film electrode generally tends to peel easily. Originally, noble metals including Ru are generally low in reactivity, with the result that a Ru film is poor in adhesion to a poly-Si contact plug or to the base layer of the interlayer dielectric film. In addition, Ru has a high melting point unlike other noble metals such as Pt. As a result, a Ru film formed by a sputtering method at low temperatures, i.e., in the vicinity of room temperature not exceeding 100° C., is very poor in crystallinity and is close to an amorphous film.

If a heat treatment is applied to a Ru film having a low crystallinity, the crystallinity of the Ru film can be improved to provide a Ru film exhibiting (00n) dominant orientation, n being a positive integer, e.g., (002) dominant orientation. However, the change in crystallinity (orienting properties) of Ru caused by the heat treatment brings about a prominently large change in stress within the Ru film, with the result that the Ru film after the heat treatment is rendered more likely to be peeled from the base layer or from the metal oxide thin film formed on the Ru film.

The term "(00n) dominant orientation" denotes that, where a polycrystalline material is evaluated by an X-ray diffraction apparatus, the peak intensity in the (00n) orientation is at least 100 times as high as that in the other orientations.

It should be noted that a dielectric film having a large dielectric constant, which covers the Ru electrode, is formed of metal oxides having a perovskite crystal structure such as $Ba_xSr_{1-x}TiO_3$ (BST) and $PbZr_xTi_{1-x}O_3$ (PZT). In order to crystallize the dielectric film having a perovskite crystal structure, it is necessary to form the dielectric film under temperatures not lower than 500° C. or to apply a heat treatment after the film formation at the high temperature given above. The heat treatment promotes crystallization of Ru as described previously. Also, the change in crystallinity of Ru brings about a prominently large change in stress within the Ru film, leading to peeling of the Ru film.

For avoiding a change in stress within the Ru film, which accompanies the ruthenium crystallization, it is considered effective to apply a heat treatment to a Ru film formed by a sputtering method at room temperature so as to crystallize the Ru film before formation of the dielectric film. According to the research conducted by the present inventors, a heat treatment at temperatures not lower than 650° C. is considered effective. The particular heat treatment is certainly effective for preventing the Ru film from being peeled from the dielectric film formed on the Ru film, but is not effective for preventing the Ru film from being peeled from the base layer of the Ru film.

For overcoming the above-noted difficulty, it may be reasonable to form a Ru film at high temperatures to enable the formed Ru film to have a high crystallinity. If a Ru film is formed at high temperatures, e.g., about 600° C., the formed film has a high crystallinity and exhibits (00n) dominant orientation. However, the stress within the Ru film is lowered to zero at the film-forming temperature of about 600° C. What should be noted is that the Ru film bears at room temperature a high thermal stress derived from a difference in thermal expansion coefficient between the base layer and the Ru film formed on the base layer. If a dielectric film is formed on the Ru film bearing a high thermal stress, a serious problem is brought about. The problem described below takes place substantially commonly in the cases where the dielectric film is formed of metal oxides having a perovskite crystal structure such as BST, PZT, (Pb, La)(Zr, Ti)$O_3$, Ba(Ti, Sn)$O_3$, and $SrBi_2Ta_2O_9$, though the description given below covers for simplification only the case where the dielectric film is formed of BST.

For crystallizing a BST film formed on a Ru film electrode, an BST film is formed by a sputtering method or a CVD method at room temperature or temperatures not higher than 400° C., followed by applying a heat treatment to the amorphous BST film at temperatures not lower than 600° C. so as to crystallize the BST film. Alternatively, a crystallized BST film is directly formed by a sputtering method or a CVD method at temperatures not lower than 400° C. In any of these cases, the crystallized BST film is formed at high temperatures ranging between about 400° C. and 600° C. It follows that the Ru film electrode bears a very small stress under the temperature range given above.

If the BST film thus formed on the Ru film electrode is left to stand at room temperature, a thermal stress derived from a difference in thermal expansion coefficient between Ru and BST resides at the interface between the BST film and the Ru electrode. In addition, a thermal stress derived from a difference in thermal expansion coefficient between Ru and the base layer resides at the interface between the two. As a result, peeling tends to take place easily at, particularly, the interface between the BST film and the Ru film. Further, since the stress within the Ru film is lowered to zero at the high crystallizing temperature, a compression stress for compressing the BST film in a thickness direction is applied to the BST film at room temperature.

Attention should also be paid to the properties of a dielectric thin film such as a BST film having a perovskite crystal structure. Specifically, a dielectric constant of the BST film is increased upon receipt of a tensile stress causing the BST film to expands in a thickness direction. In contrast, the dielectric constant is decreased upon receipt of a compression stress causing the BST film to be compressed in a thickness direction. It follows that the BST film fails to exhibit a dielectric constant inherent in BST depending on the stress applied thereto.

The various problems given above can be overcome, if it is possible to form in the vicinity of room temperature a Ru film having such a high crystallinity as to remain unchanged even after subsequent formation of a dielectric film on the Ru film. If the Ru film formed in the vicinity of room temperature is sufficiently crystallized, the high crystallinity is left unchanged even after the subsequent heat treating steps. It follows that it is possible to suppress a change in stress accompanying a change in crystallinity, making it possible to suppress the peeling of the film caused by a change in stress in the Ru film.

It should be noted that a thermal stress residing in a Ru film formed in the vicinity of room temperature (not higher than 100° C.) is not larger than $2\times10^9$ dyn/cm$^2$, which is negligibly small, and stress in the Ru film is substantially zero at room temperature. It follows that it is substantially impossible for the stress derived from the thermal stress of the Ru film to be applied to the dielectric film (BST film) so as to cause the film peeling. Further, if a BST film covering the Ru film formed at room temperature is crystallized at high temperatures, a tensile stress causing the BST film to be expanded in a thickness direction is applied to the BST film. It follows that the dielectric constant of the BST film is increased so as to increase the charge accumulating capacity of the BST film.

The present inventors have conducted extensive research on a method of forming in the vicinity of room temperature a Ru film having such a high crystallinity as to remain unchanged even after subsequent formation of a dielectric film on the Ru film without relying on the conditions of the base layer such as capability of expitaxial growth. As a result, it has been found that a Ru film exhibiting a very high (00n) dominant orientation can be formed by forming a Ru film by a sputtering method at room temperature on a Ta film formed in advance by a sputtering method. It has also been found that the Ru film thus formed does not peel from the Ta film or from a dielectric film subsequently formed on the Ru film. Further, the Ru film thus formed has been found to bear a very low stress.

Figure 2:
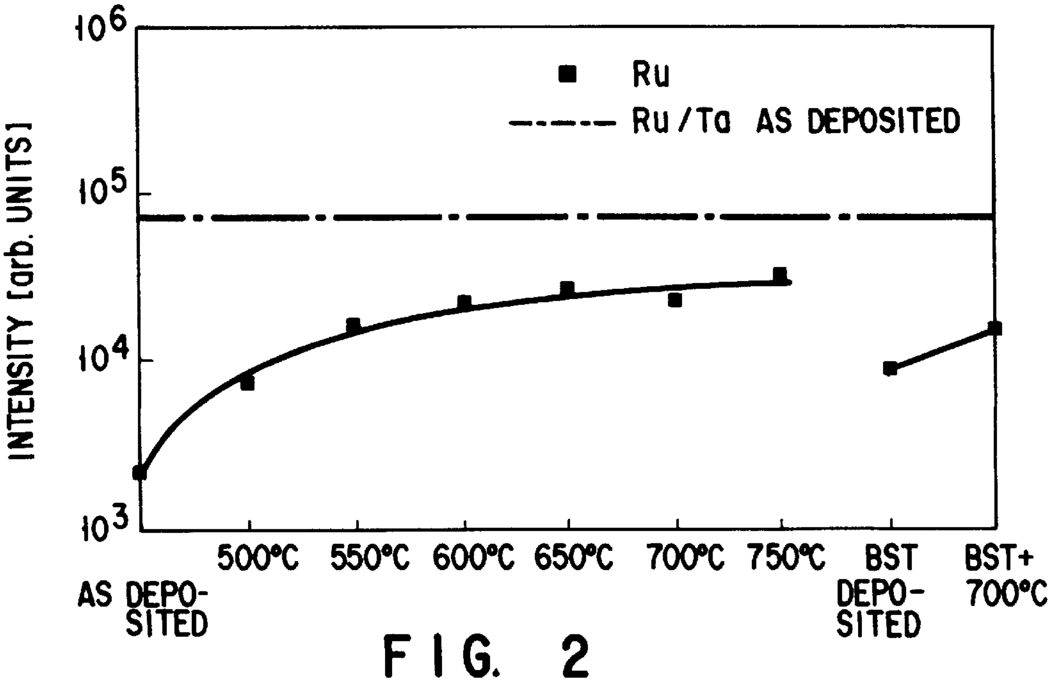
FIG. 2 is a graph showing the crystallinity of ruthenium films formed in the present invention and by the conventional method.

What should also be noted is that the Ru film formed by a sputtering method on the Ta film has an excellent crystallinity, as shown in FIG. 2. Specifically, the crystallinity of a Ru film formed at room temperature on a Ta film has been found to be higher than that of a Ru film formed by an ordinary method at room temperature on a silicon oxide film even after application of a heat treatment at 750° C. to the Ru film formed on the silicon oxide film. The Ru/Ta laminate film tested for obtaining the data plotted in FIG. 2 was formed on an amorphous silicon oxide film. This clearly supports that the excellent crystallinity of the Ru film is irrelevant to the conditions of the base layer.

As a matter of fact, the present inventors formed a Ru/Ta laminate film on each of a silicon film, a tungsten film, and a silicon nitride film. It has been found that the Ru film exhibits an excellent crystallinity in each of these cases. Further, a BST film formed by a CVD method on the Ru/Ta laminate film has also been found to exhibit an excellent crystallinity and have a large dielectric constant. Still further, the Ta film positioned below the Ru film has been found to exhibit (311) orientation. In other words, Ta and Ru are made equal to each other in the face orientation so as to increase the dielectric constant of the BST film.

In the experiment described above, the BST film was formed by a CVD method using as a raw material gas $Sr(THD)_2$, $Ba(THD)_2$, $Ti(THD)_2(OC_3H_7)_2$, and $O_2$, where "THD" is an abbreviation of 2,2,6,6-tetramethyl-3,5-heptanedionate. The BST film was formed at 480° C. and under 200 Pa.

It has also been found that the Ru/Ta laminate film can be connected to a poly-Si plug widely used in a semiconductor device manufacturing process without bringing about silicidation at temperatures not higher than 650° C., making it possible to achieve a practical device structure very easily.

As described above, the method of the present invention makes it possible to form a high quality metal oxide thin film on a Ru/Ta electrode. If the present invention is employed for forming a dielectric thin film of, for example, $Ba_{0.5}St_{0.5}TiO_3$, it is possible to form a capacitor including a dielectric thin film capable of accumulating electric charge in a high density. Particularly, peeling of the film caused by an electrode need not be worried about in this case. It follows that the present invention makes it possible to manufacture a highly reliable semiconductor memory device such as DRAM or FRAM.

There will now be described some Examples of the present invention with reference to the accompanying drawings.

EXAMPLE 1

Figure 3A:
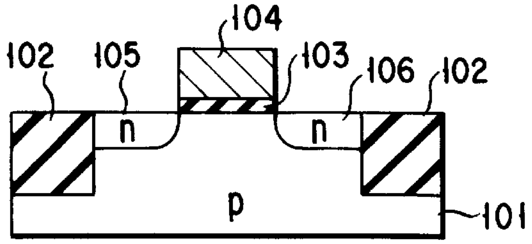
FIGS. 3A to 3D are cross sectional views collectively showing how to manufacture a semiconductor device according to one embodiment of the present invention.

FIGS. 3A to 3D are cross sectional views collectively showing a method of manufacturing a semiconductor device according to one embodiment of the present invention. In the first step, an element isolating insulating film 102 is formed in the surface of a p-type single crystalline silicon substrate 101, as shown in FIG. 3A. Then, a thermal oxide film and a poly-Si film are successively formed on the silicon substrate 101, followed by selectively removing these films by an ordinary photolithography and reactive ion etching to form a gate oxide film 103 and a gate electrode 104. Further, an n-type impurity is selectively introduced by an ion implantation technique into a surface region of the silicon substrate 101 to form n-type source-drain regions 105, 106 apart from each other.

Figure 3B:
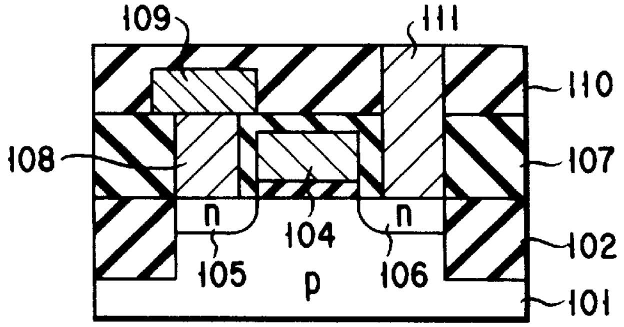

After formation of the source-drain regions 105, 106, a CVD oxide film 107 is formed as an interlayer dielectric film, followed by forming a contact hole communicating with the n-type source region 105 in the CVD oxide film 107, and subsequently burying a poly-Si film 108 in the contact hole as shown in FIG. 3B. The poly-Si film 108 thus formed is doped with phosphorus. Then, a tungsten silicide film is formed on the entire surface, followed by patterning the silicide film by an ordinary photoetching to form a bit line 109. Further, a CVD oxide film 110 is deposited on the entire surface, followed by selectively removing the CVD films 110, 107 by the ordinary photolithography and reactive ion etching to form a contact hole communicating with the n-type drain region 106. After formation of the contact hole, an As-doped poly-Si film is formed by CVD on the entire surface, followed by etching back the poly-Si film to form an As-doped poly-Si film 111 in the contact hole, thereby forming a contact plug for connecting the n-type drain region 106 to a capacitor which is to be formed later.

Figure 3C:
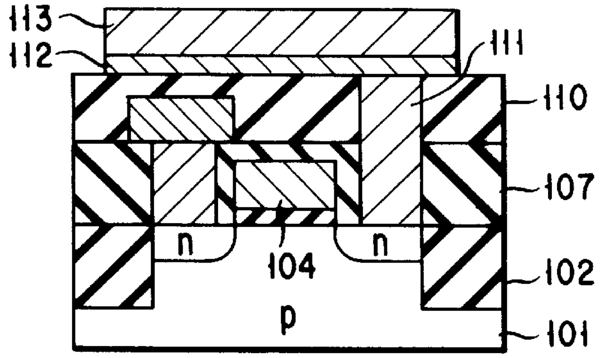

Further, a Ta film 112 having a thickness of 20 nm and a Ru film 113 having a thickness of 50 nm are successively formed on the entire surface by a sputtering method at room temperature (25° C.), as shown in FIG. 3C, followed by patterning these Ru film 113 and Ta film 112 by the ordinary photoetching to form a lower electrode of a capacitor element.

Figure 3D:
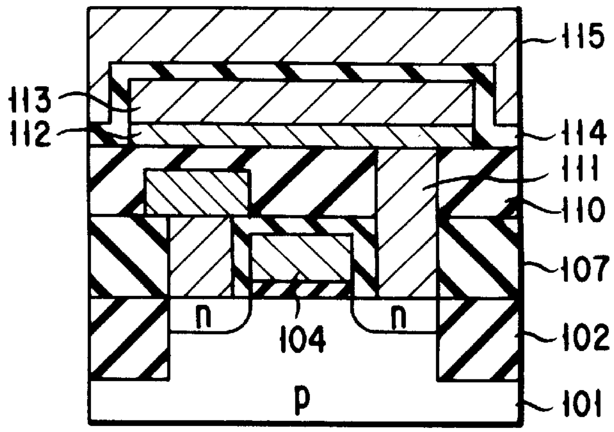

After formation of the lower electrode, a BST film 114 is formed in a thickness of 30 nm by a CVD method using as raw materials $Ba(THD)_2$, $TiO(THD)_2$, $Sr(THD)_2$, and $O_2$, as shown in FIG. 3D. The CVD was performed under temperature of 480° C. and pressure of 200 Pa, with the result that the resultant BST film 114 was quite satisfactory in step coverage. Also, the Ta film 112 and the Ru film 113 were found to exhibit (311) dominant orientation and (002) dominant orientation, respectively. Further, a Ru film 115 was formed by a sputtering method in a thickness of 50 nm as a capacitor upper electrode, thereby forming a memory cell portion of a DRAM.

An integrated circuit is completed by further forming a passivation film and wirings by an ordinary LSI manufacturing process, though these steps are omitted.

In the capacitor included in the embodiment described above, the BST film 114 exhibiting a large dielectric constant is used as a dielectric film. Also, the Ru film 113 formed in the vicinity of room temperature and having a high crystallinity is used as a lower electrode of the capacitor. It should be noted that the Ru film 113 does not undergo a change in crystallinity in the growing step of the BST film 114. Also, the stress in the Ru film 113 is originally small at room temperature. It follows that the stress applied from the Ru/Ta laminate film (lower electrode) to the BST film 114 and applied from the lower electrode to the base layer is very small, leading to an improved adhesion between the BST film 114 and the lower electrode and between the lower electrode and the base layer, i.e., interlayer dielectric film 110 or contact plug 111.

What should also be noted is that the dielectric constant of a BST film having a perovskite crystal structure is known to be lowered upon receipt of stress. In Example 1, however, the stress in the Ru film 113 is substantially zero at room temperature and, thus, the presence of the Ru film 113 does not bring about reduction in the dielectric constant of the BST film 114. It follows that the capacitor included in the semiconductor memory device performs a satisfactory function.

EXAMPLE 2

Figure 4A:
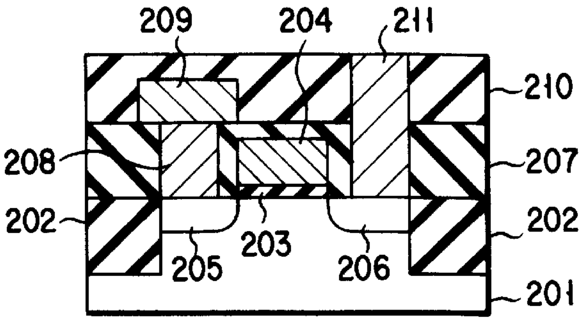
FIGS. 4A to 4D are cross sectional views collectively showing how to manufacture a semiconductor device according to another embodiment of the present invention.

FIGS. 4A to 4D are cross sectional views collectively showing a method of manufacturing a semiconductor device according to another embodiment of the present invention. The members denoted by reference numerals 201 to 215 in FIGS. 4A to 4D correspond to those denoted by reference numerals 101 to 115 in FIGS. 3A to 3D. Also, the steps required for preparing the structure shown in FIG. 4A are basically equal to those described in conjunction with Example 1 with reference to FIGS. 3A and 3B.

To reiterate, an element isolating insulating film 202 is formed on a p-type single crystalline silicon substrate 201 in the first step, followed by forming a gate oxide film 203 and a gate electrode 204. Further, an n-type impurity is selectively introduced by an ion implantation into a surface region of the silicon substrate 201 to form n-type source-drain regions 205, 206. After formation of these source-drain regions, a CVD oxide film 207 is formed as an interlayer insulating film, followed by forming in a contact hole communicating with the n-type source region 205 the CVD oxide film 207, and subsequently burying a poly-Si film 208 in the contact hole. The poly-Si film 208 thus formed is doped with phosphorus. Then, a tungsten silicide film is formed on the entire surface, followed by patterning the silicide film by an ordinary photoetching to form a bit line 209. Further, a CVD oxide film 210 is deposited on the entire surface, followed by selectively removing the CVD films 210, 207 by the ordinary photolithography and reactive ion etching to form a contact hole communicating with the n-type drain region 206. After formation of the contact hole, an As-doped poly-Si film 211 is formed in the contact hole as a contact plug, thereby forming the structure shown in FIG. 4A.

Figure 4B:
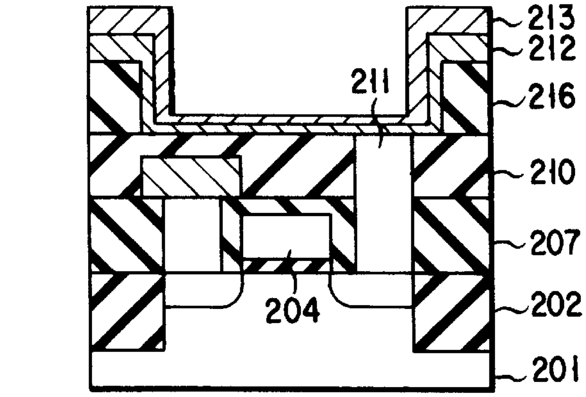

In the next step, a silicon oxide film 216 is formed on the entire surface by a plasma CVD method, followed by patterning the CVD oxide film 216 by the ordinary photolithography and dry etching to form a recess in which a capacitor of a DRAM is to be formed, as shown in FIG. 4B. Further, a Ta film 212 having a thickness of 10 nm and a Ru film 213 having a thickness of 20 nm are successively formed on the entire surface by a sputtering method at room temperature (25° C.).

Figure 4C:
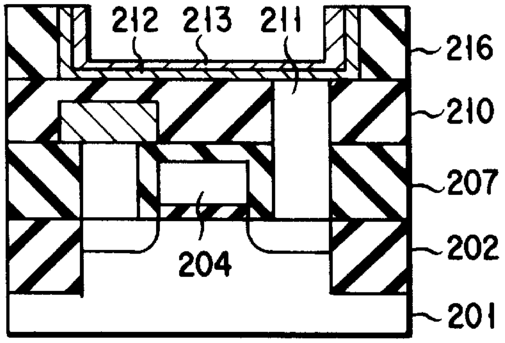

The Ru film 213 and the Ta film 212 are patterned by a chemical mechanical polishing to form a lower electrode of a capacitor, as shown in FIG. 4C.

Figure 4D:
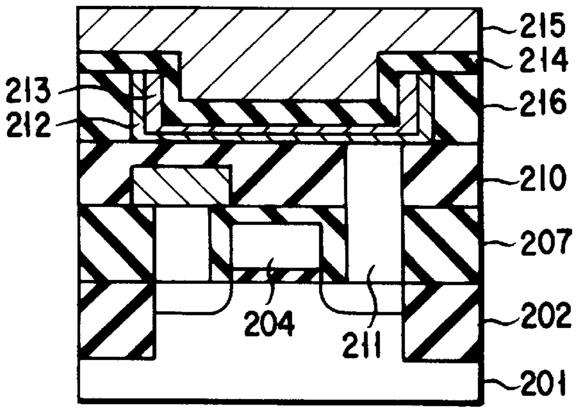

After formation of the lower electrode, a BST film 214 is formed at 480° C. in a thickness of 30 nm by CVD using as raw materials $Ba(THD)_2$, $TiO(THD)_2$, $Sr(THD)_2$, and $O_2$, as shown in FIG. 4D. The BST film 214 thus formed was quite satisfactory in step coverage.

After formation of the BST film 214, the crystallinity was evaluated with respect to of the BST film 214, the Ta film 212 and the Ru film 213, with the result that the BST film 214, the Ta film 212 and the Ru film 213 were found to exhibit (110) dominant orientation, (311) dominant orientation and (002) dominant orientation, respectively. Further, a Ru film 215 was formed in a thickness of 100 nm as an upper electrode by a sputtering method, thereby forming a memory cell portion of a DRAM.

An integrated circuit is completed by further forming a passivation film and wirings by an ordinary LSI manufacturing process, though these steps are omitted.

In the embodiment described above, the Ru/Ta laminate film is used as a lower electrode of the capacitor, making it possible to prevent the lower electrode from peeling. Further, the prominent effects similar to those obtained in Example 1 can also be obtained in Example 2.

The present invention is not limited to the Examples described above. In the Examples described above, an As-doped poly-Si film is used as a contact plug. However, other materials such as tungsten, tungsten nitride and titanium nitride can also be used for forming the contact plug. Also, the material of the metal oxide dielectric film is not limited to BST. Other metal oxides exhibiting a large dielectric constant such as PZT can also be used for forming the dielectric film. Particularly, a capacitor having a large capacitance can be formed in the case of using $Ta_2O_5$ for forming the dielectric film.

Further, it is not absolutely necessary to employ a sputtering method for forming a Ru film. For example, a CVD method or a plating method can also be employed in place of the sputtering method for forming the Ru film. Still further, various other modifications can be employed within the technical scope of the present invention.

As described above, the present invention makes it possible to form a ruthenium film electrode which has a high crystallinity and is not peeled. In addition, a high quality metal oxide dielectric film can be formed on the Ru film. For example, it is possible to form on the Ru film electrode a dielectric film of $(Ba, Sr)TiO_3$ having a large dielectric constant and exhibiting (110) dominant orientation. It follows that the present invention permits manufacturing a semiconductor memory device of high performance and high reliability by employing the metal oxide dielectric film formed by the method specified in the present invention in forming a capacitor included in a memory cell.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

What is claimed is:

1. A semiconductor device, comprising a substrate, and a capacitor formed on the substrate and including a lower electrode formed of a lower sub-layer consisting essentially of tantalum and an upper sub-layer consisting essentially of ruthenium formed on the lower sub-layer, a metal oxide thin film formed on the ruthenium film of the lower electrode, and an upper electrode formed on the metal oxide thin film, said ruthenium film exhibiting (00n) dominant orientation, where n denotes a positive integer.

2. The semiconductor device according to claim 1, wherein said tantalum film included in the lower electrode exhibits (311) or (00n) dominant orientation, where n denotes a positive integer.

3. The semiconductor device according to claim 1, wherein said metal oxide thin film consists of $Ba_xSr_{1-x}TiO_3$ ($0 \leqq x \leqq 1$).

4. The semiconductor device according to claim 1, wherein said ruthenium film included in the lower electrode has a thickness of at least 2 nm.

5. The semiconductor device according to claim 1, wherein said tantalum film included in the lower electrode has a thickness not exceeding 50 nm.

6. A semiconductor device, comprising:

a semiconductor substrate;

a cell transistor formed in said semiconductor substrate;

an interlayer dielectric film in which is formed a contact hole communicating with a part of said cell transistor;

a contact plug buried in said contact hole formed in said interlayer dielectric film;

a capacitor lower electrode formed of a lower sub-layer consisting essentially of tantalum and an upper sub-layer consisting essentially of ruthenium formed on the lower sub-layer, said lower electrode being formed on said interlayer dielectric film and connected to said contact plug;

a capacitor dielectric film formed on the ruthenium film included in said capacitor lower electrode and consisting essentially of a metal oxide; and a capacitor upper electrode formed on said capacitor dielectric film, wherein said ruthenium film exhibits (00n) dominant orientation, where n denotes a positive integer.

7. The semiconductor device according to claim 6, wherein said tantalum film included in the capacitor lower electrode exhibits (311) or (00n) dominant orientation, where n denotes a positive integer.

8. The semiconductor device according to claim 6, wherein said capacitor dielectric film consists essentially of $Ba_xSr_{1-x}TiO_3$ ($0 \leqq x \leqq 1$).

9. The semiconductor device according to claim 6, wherein said ruthenium film included in the capacitor lower electrode has a thickness of at least 2 nm.

10. The semiconductor device according to claim 6, wherein said tantalum film included in the capacitor lower electrode has a thickness not exceeding 50 nm.

11. The semiconductor device according to claim 6, wherein said interlayer insulating film consists essentially of silicon oxide, and said contact plug consists essentially of poly-Si.

* * * * *